United States Patent
Ganesan et al.

(10) Patent No.: US 7,707,378 B2
(45) Date of Patent: Apr. 27, 2010

(54) DDR FLASH IMPLEMENTATION WITH HYBRID ROW BUFFERS AND DIRECT ACCESS INTERFACE TO LEGACY FLASH FUNCTIONS

(75) Inventors: Ramkarthik Ganesan, Folsom, CA (US); Saad Monasa, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 767 days.

(21) Appl. No.: 11/607,656

(22) Filed: Nov. 30, 2006

(65) Prior Publication Data
US 2008/0133819 A1 Jun. 5, 2008

(51) Int. Cl.
*G06F 12/00* (2006.01)

(52) U.S. Cl. ......... 711/167; 711/104; 711/105; 711/E12.026; 711/141; 711/103

(58) Field of Classification Search ............ None
See application file for complete search history.

(56) References Cited

U.S. PATENT DOCUMENTS

| | | | | |
|---|---|---|---|---|
| 6,154,393 A | * | 11/2000 | Otsuka et al. | 365/189.02 |
| 2004/0083319 A1 | * | 4/2004 | Bennett | 710/52 |
| 2007/0180197 A1 | * | 8/2007 | Wright et al. | 711/141 |

* cited by examiner

*Primary Examiner*—Reginald G Bragdon
*Assistant Examiner*—Baboucarr Faal
(74) *Attorney, Agent, or Firm*—Kacvinsky LLC

(57) ABSTRACT

A Double Data Rate (DDR) nonvolatile memory includes a DDR I/F block to receive an address that is used to separate DDR data into coherent data and non-coherent data that are stored separately in the DDR nonvolatile memory.

18 Claims, 3 Drawing Sheets

US 7,707,378 B2

DDR FLASH IMPLEMENTATION WITH HYBRID ROW BUFFERS AND DIRECT ACCESS INTERFACE TO LEGACY FLASH FUNCTIONS

Recent developments in a number of different digital technologies have greatly increased the need to transfer large amounts of data from one device to another or across a network to another system. Technological developments permit digitization and compression of large amounts of voice, video, imaging, and data information, which may be rapidly transmitted from computers and other digital equipment to other devices within the network. Computers have faster central processing units and substantially increased memory capabilities, which have increased the demand for devices that can more quickly store and transfer large amounts of data.

These developments in digital technology have stimulated a need to deliver ever faster storage devices to supply data to these processing units. Double Data Rate (DDR) SDRAM included in main memories for computing systems provides improvements in performance but does not provide permanent storage. Further improvements in faster, permanent data storage are needed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
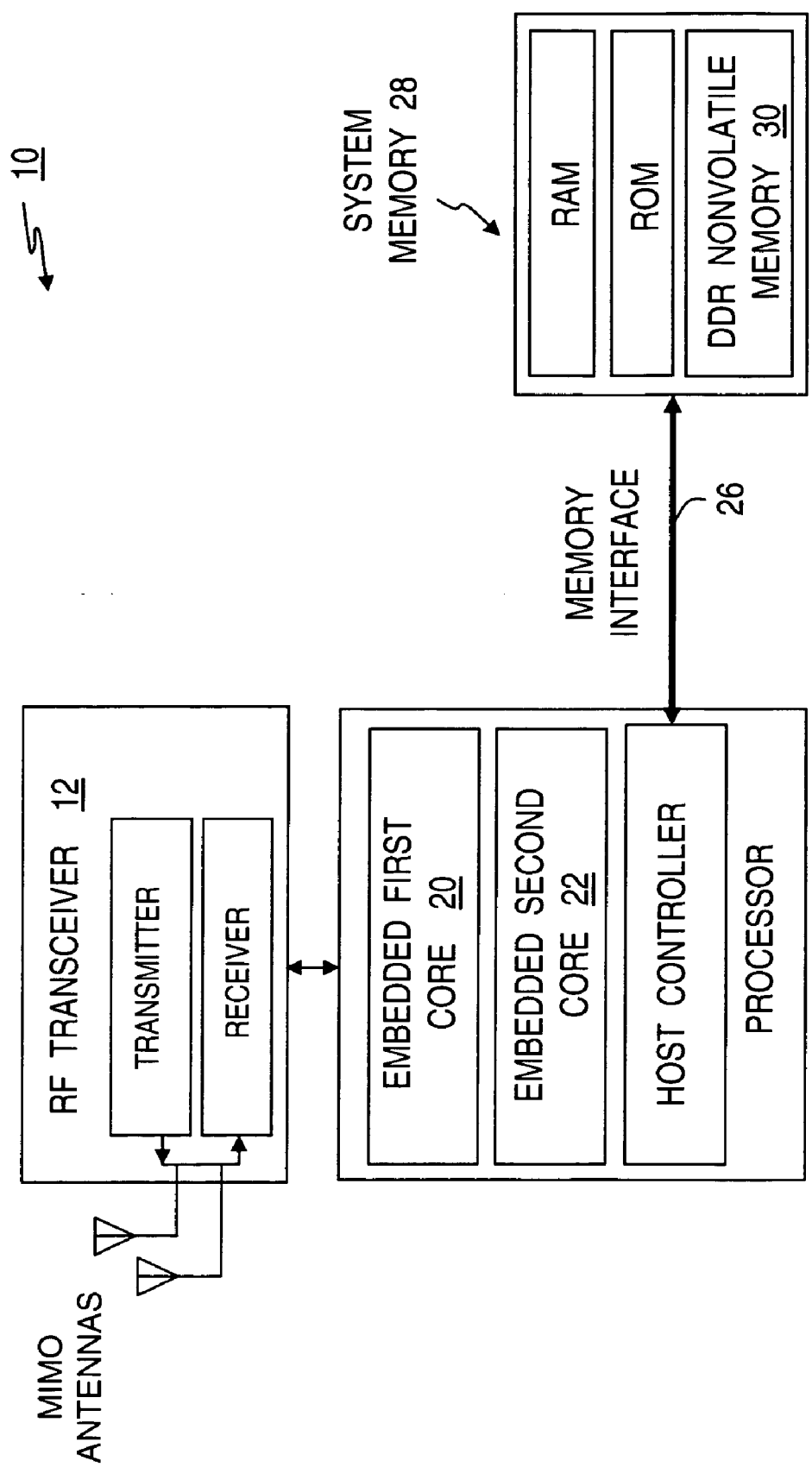
FIG. 1 is a diagram that illustrates a wireless device with a Double Data Rate (DDR) nonvolatile memory in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As shown in FIG. 1, the embodiment illustrates a device 10 as a wireless communications device that includes a radio to allow communication with other devices. Accordingly, communications device 10 may operate in a wireless network and be any type of device capable of communicating in an RF/location space with another device. However, it should be pointed out that device 10 is not limited to wireless embodiments and the present invention may have applications in a variety of products. For instance, the claimed subject matter may be incorporated into desktop computers, laptops, smart phones, MP3 players, cameras, communicators and Personal Digital Assistants (PDAs), medical or biotech equipment, automotive safety and protective equipment, automotive infotainment products, etc. However, it should be understood that the scope of the present invention is not limited to these examples.

The figure illustrates the wireless embodiment where a transceiver 12 receives and transmits a modulated signal from multiple antennas. Analog front end transceiver 12 may be a stand-alone Radio Frequency (RF) discrete or integrated analog circuit. Transceiver 12 may also be embedded with a processor as a mixed-mode integrated circuit, where the processor, in general, processes functions that fetch instructions, generate decodes, find operands, and perform appropriate actions, then stores results. The processor may include baseband and applications processing functions and utilize one or more processor cores to handle application functions and allow processing workloads to be shared across the cores.

The processor may transfer data through an interface 26 to a system memory 28 that may include a combination of memories such as a Random Access Memory (RAM), a Read Only Memory (ROM) and a nonvolatile memory, although neither the type of memory, variety of memories, nor combination of memories included in system memory 28 is a limitation of the present invention. Nonvolatile memory 26 may be a memory such as, for example, an ETOX™ Flash NOR Memory, an Electrically Erasable and Programmable Read Only Memory (EEPROM), a Ferroelectric Random Access Memory (FRAM), a Polymer Ferroelectric Random Access Memory (PFRAM), a Magnetic Random Access Memory (MRAM), an Ovonics Unified Memory (OUM), or any other device capable of storing instructions and/or data and retaining that information even with device 10 in a power conservation mode. However, it should be understood that the scope of the present invention is not limited to these examples for a nonvolatile memory.

In accordance with the present invention the architecture of device 10 includes a Double Data Rate (DDR) nonvolatile memory 30 as a high-bandwidth technology that supports data transfers on both the rising and falling edges of each clock cycle. The clock signal transitions from "0" to "1" and back to "0" each cycle with the first transition called the "rising edge" and the second transition the "falling edge". Normally only one of these clock signal transitions is used to trigger a data transfer but with DDR nonvolatile memory 30 both clock edges are used, effectively doubling the memory's bandwidth by transferring data twice per clock signal. Again, in accordance with the present invention the DDR nonvolatile memory 30 architecture accommodates legacy flash functions while implementing DDR behavior.

Figure 2:
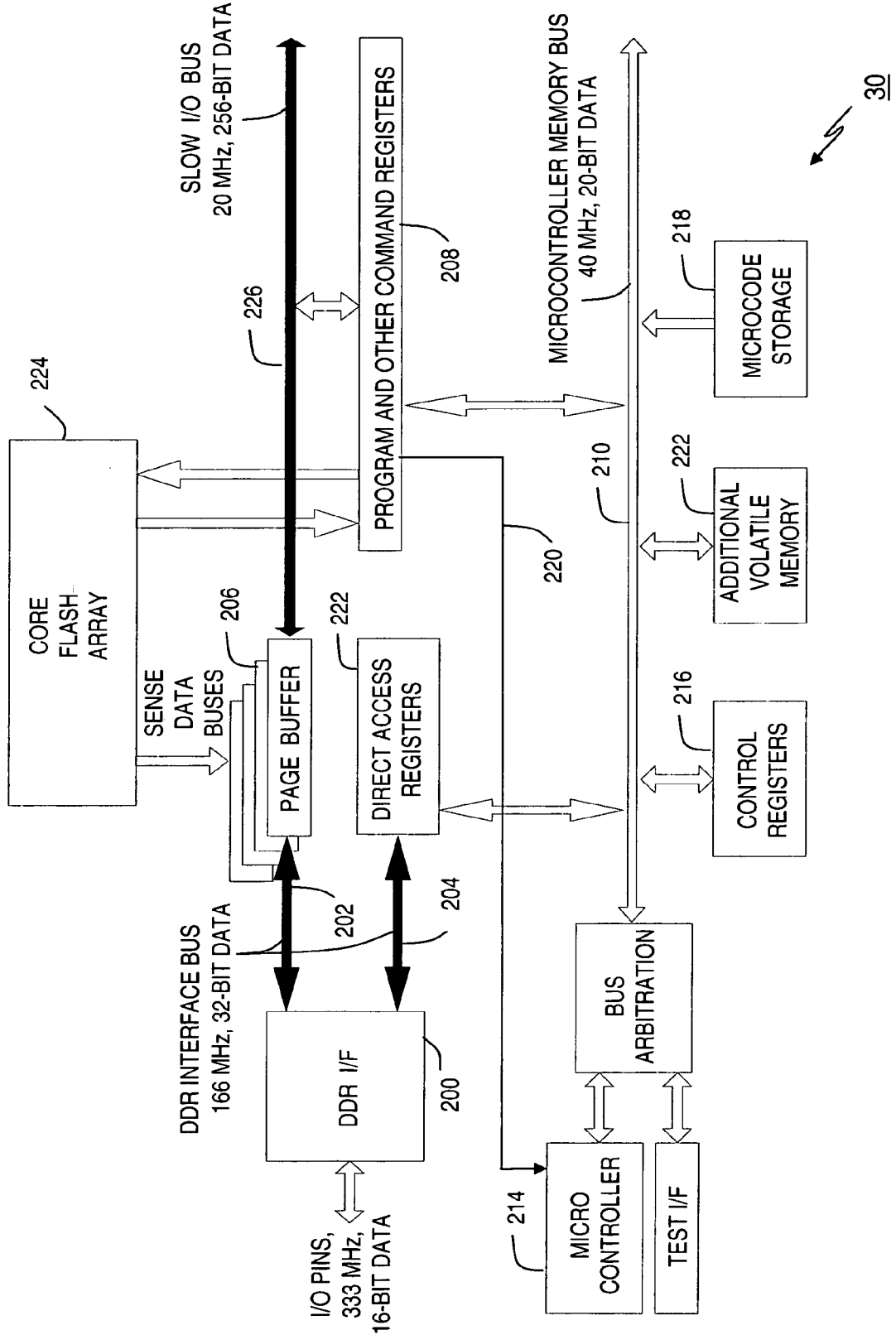
FIG. 2 is a diagram that illustrates an embodiment of the DDR nonvolatile memory with coherent data accesses directed to the direct access registers and non-coherent data accesses directed to the page buffer in accordance with the present invention.

FIG. 2 is a block diagram that illustrates one embodiment of the structure of DDR nonvolatile memory 30 that allows implementation of flash functions while maintaining the interface similarities to exiting DDR methods. The structure includes a DDR I/F block 200 designed to transfer two data words per clock cycle at the I/O pins of the memory device. The DDR I/F block 200 is connected to a DDR interface bus 202 that transfers data between the external host processor and page buffers and a DDR interface bus 204 that transfers data between the external host processor and registers in the memory device. Again, DDR I/F block 200 maintains similarities to exiting DDR methods by transferring data on both edges of the host processor system clock and converting the 32-bit single edged data on DDR interface buses 202 and 204 to the 16-bit double edged data that is transferred to the host processor.

The architecture of DDR nonvolatile memory 30 includes direct access registers 222 to facilitate coherent data accesses and hybrid page buffers 206 to facilitate non-coherent data accesses. The architecture of DDR nonvolatile memory 30 is extensible to new features and functionality in providing programmers with trade-offs, using non-coherent behaviors for improved performance along with coherent behaviors for ease of programming. DDR I/F block 200 uses the input address to determine the type of array accesses and distinguishes coherent data accesses from non-coherent data accesses.

The path that includes DDR I/F block 200, DDR interface bus 204 and direct access registers 222 provide memory accesses that are coherent in that all processes agree on the order of all memory events. Coherent data types have specific read and write timing criteria that calls for minimal latency between the system and the flash device. Some examples of coherent data types include the status registers and the command interface that have specific sequencing requirements. Direct access registers 222 interface with the DDR I/F block 200 and an internal microcontroller 214. Direct access registers 222 may store device configuration and device status information. Microcontroller 214 polls the direct access registers for configuration information and/or loads the registers with the status information.

In accordance with the present invention, direct access registers 222 have been limited to a few registers designed to be burst out coherent data directly through the DDR interface bus 204 to the DDR I/F block 200. To reduce design complexity, the architecture of DDR nonvolatile memory 30 limits the number of registers that function at the high system speeds in order. The internal higher speed paths of DDR nonvolatile memory 30 are limited to the buffer, the I/O ring and the registers included in direct access registers 222. Thus, the other internal registers, the SRAM arrays, and other functional blocks do not operate at the DDR speeds. Yet, the architecture allows the host processor to directly access the direct access registers 222 to ensure coherency and allow the system to always read out the most recent data. To access the coherent data in DDR nonvolatile memory 30, commands issued by the external host processor are received through the memory interface 26 and decoded by the DDR I/F block 200. The address and commands direct the source/destination of the data. By way of example, an "active" command may select a register based on the address and a "read" command may execute a burst operation of data from the selected register. Note that an "active" command followed by a "write" command allows for direct write back to these registers.

However, the non-coherent data type does not need sequencing and can withstand larger latency between system and the flash device. The architecture of DDR nonvolatile memory 30 provides the path that includes DDR I/F block 200, DDR interface bus 202 and page buffers 206 to provide non-coherent memory accesses. Note that non-coherent data need not be accessed directly, and thus, page buffers 206 are bank buffers that allow the non-coherent data to be transferred in a background operation. An "active" command issued by the host processor to a non-array address transfers the non-coherent data to the row buffer for a burst operation. The non-coherent data copied to the page buffers 206 is a snapshot of the value during the "active" cycle. Note that these data types do not change over time and these data types are only updated by the system.

Writing to DDR nonvolatile memory 30 may be accomplished using a two step process. First, the data is stored in one of the internal volatile registers, and second, the data is transferred from the volatile register to the eventual non-volatile storage by a command issued by internal microcontroller 214. Writing to these volatile registers may also be done through the read buffers. A write operation initially writes to the buffer.

The transfer of data to the registers for internal manipulation may be done by closing the bank buffer which transfers the data to the register destination. A command is then issued by microcontroller 214 to do internal manipulations and storage to the eventual non-volatile storage. Microcontroller 214 accesses the internal flash registers and microcode for its execution using the microcontroller memory bus 210. Note that the write operation involves a bus transfer speed that corresponds to the buffer closure latency in order to not interrupt subsequent operations. An alternate approach to transferring the data to the registers is to have automated data transfer (synchronization) between the read buffer and the register where the data belongs. An internal state machine (not shown) may be used to avoid conflicts between external data writes and internal data transfers.

Figure 3:
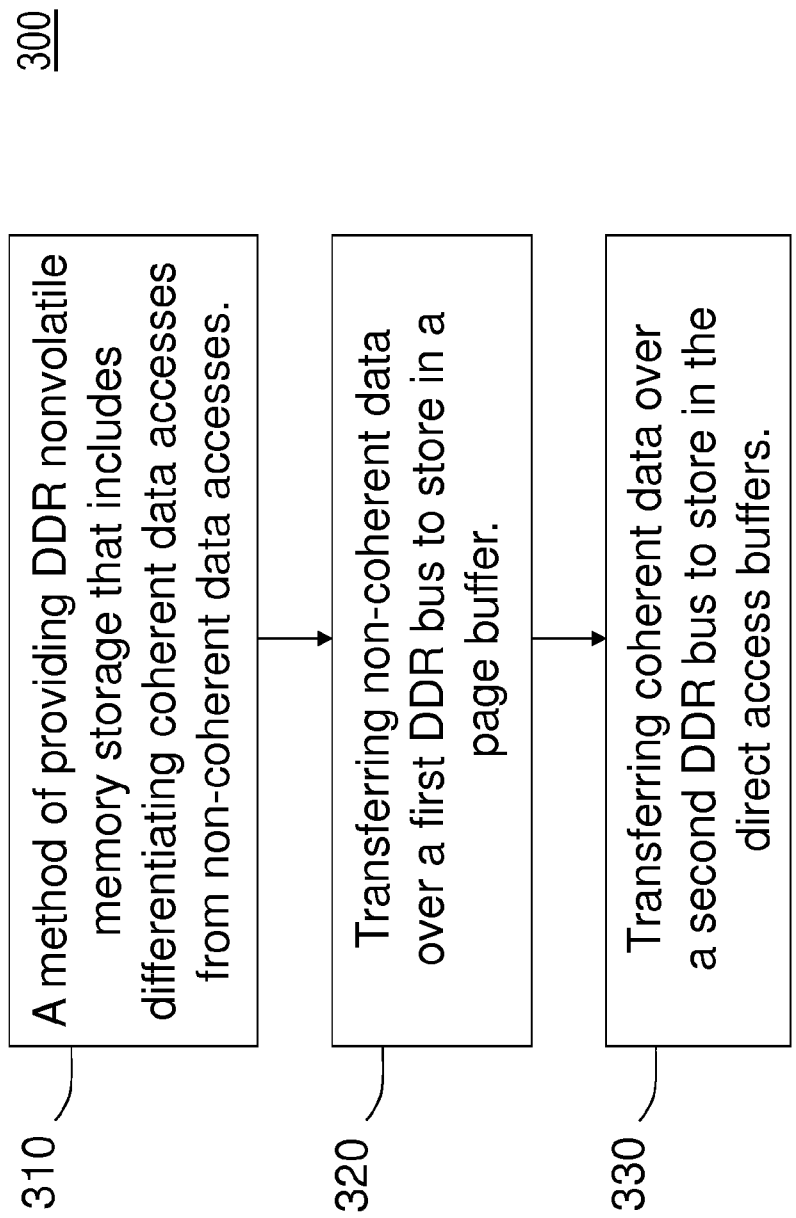
FIG. 3 is a flow diagram that illustrates an operational step within the DDR nonvolatile memory.

FIG. 3 shows a flowchart in accordance with various embodiments of the present invention that illustrates an algorithm or process in accordance with the present invention that may be used to provide a flash memory with DDR behavior. Method 300 or portions thereof are performed by the processor/flash device combination of an electronic system. Method 300 is not limited by the particular type of apparatus, software element, or system performing the method. Also, the various actions in method 300 may be performed in the order presented, or may be performed in a different order.

Method 300 is a method of providing DDR nonvolatile memory storage. The method includes, at block 310, detecting and differentiating coherent data accesses from non-coherent data accesses. In block 320 data detected as non-coherent data is transferred over the DDR interface bus 202 to store in page buffers 206. In block 330 data detected as coherent data is transferred over the DDR interface bus 204 to store in direct access registers 222.

By now it should be apparent that the present architecture for DDR nonvolatile memory 30 maintains the interface similarities to DDR SRAM, and by so doing, accommodates legacy flash functions while implementing DDR behavior. Flash device writes are not coherent by nature and long time intervals may be needed to internally transfer data that is to be written to the core flash array. However, the coherent and non-coherent aspects of the DDR flash device are accounted for and addressed in the architecture to accommodate flash device behavior. This flash device has the capability to identify the different data accesses (array data, coherent non-array data and non-cohered non-array data) based on the address input during the active cycle. A separate memory map is used for these data types or specific register based indirect address schemes are used.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A method of providing Double Data Rate (DDR) non-volatile memory storage, comprising:

differentiating coherent data accesses from non-coherent data accesses;

transferring coherent data over a first DDR bus to store in a direct access register; and transferring non-coherent data over a second DDR bus to store in a page buffer.

2. The method of claim 1 wherein differentiating coherent data accesses from non-coherent data accesses further includes monitoring an address input during an active cycle.

3. The method of claim 2 wherein monitoring an address input includes monitoring the address input using a DDR interface block.

4. The method of claim 1 wherein different data accesses use either the first or second DDR bus based on a separate memory map.

5. The method of claim 1 further including writing data in a volatile register to transfer to non-volatile storage by a command issued by an internal microcontroller in the (DDR) nonvolatile memory.

6. A method of receiving Double Data Rate (DDR) data in a nonvolatile memory device, comprising:

receiving the DDR data at an input of the nonvolatile memory device in a DDR interface block that detects coherent data accesses from non-coherent data accesses;

transferring coherent data over a first DDR bus to store in a direct access register; and transferring non-coherent data over a second DDR bus to store in a page buffer.

7. The method of claim 6 wherein receiving the DDR data at the input of the nonvolatile memory device includes receiving two data words per clock cycle and the first DDR bus transfers one data word per clock cycle.

8. The method of claim 6 wherein receiving the DDR data at the input of the nonvolatile memory device transfers two data words per clock cycle and the second DDR bus transfers one data word per clock cycle.

9. The method of claim 6 wherein detecting coherent data accesses from non-coherent data accesses further includes monitoring an address input of the DDR I/F block.

10. The method of claim 6 wherein the nonvolatile memory device further includes a microcontroller to poll the direct access register for configuration information.

11. The method of claim 10 wherein the microcontroller polls the direct access register for status information.

12. A method of operating a Double Data Rate (DDR) nonvolatile memory with a host processor in a device, comprising:

transferring DDR data from the host processor to the DDR nonvolatile memory;

using an address associated with the DDR data to detect coherent data from non-coherent data; and separating the DDR data at an input of the nonvolatile memory to transfer over a first DDR bus to a direct access register for coherent data and over a second DDR bus to a page buffer for non-coherent data.

13. The method of claim 12 wherein using an address associated with the DDR data to detect coherent data from non-coherent data further includes using a DDR interface block in the DDR nonvolatile memory to monitor the address.

14. The method of claim 12 further including transferring the coherent data from the direct access register to command registers using a third bus and transferring non-coherent data from the page buffer to the command registers using a fourth bus.

15. A wireless device, comprising:

multiple antennas;

a transceiver coupled to the multiple antennas;

a processor coupled to the transceiver; and a Double Data Rate (DDR) nonvolatile memory coupled to the processor, the DDR nonvolatile memory including a DDR interface block to receive an address from the processor that is used to separate DDR data received from the processor into coherent data and non-coherent data that are stored separately in the DDR nonvolatile memory.

16. The wireless device of claim 15 wherein the coherent data is stored in a direct access register.

17. The wireless device of claim 15 wherein the non-coherent data is stored in a page buffer.

18. The wireless device of claim 15, wherein the coherent data is transferred from an input of the DDR nonvolatile memory to the direct access registers over a first bus and the non-coherent data is transferred over a second bus from the input of the DDR nonvolatile memory to the page buffer.

* * * * *